US007790049B2

(12) United States Patent
Terasaki et al.

(10) Patent No.: US 7,790,049 B2
(45) Date of Patent: Sep. 7, 2010

(54) PRODUCTION PROCESS OF STRUCTURE

(75) Inventors: Atsunori Terasaki, Kawasaki (JP); Junichi Seki, Yokohama (JP); Toshiki Ito, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 531 days.

(21) Appl. No.: 11/843,873

(22) Filed: Aug. 23, 2007

(65) Prior Publication Data
US 2008/0047932 A1 Feb. 28, 2008

(30) Foreign Application Priority Data
Aug. 25, 2006 (JP) ............... 2006-229052
Jun. 4, 2007 (JP) ............... 2007-148555

(51) Int. Cl.
*B44C 1/22* (2006.01)
*C03C 15/00* (2006.01)
*C03C 25/68* (2006.01)
*C23F 1/00* (2006.01)

(52) U.S. Cl. ............... 216/58; 216/80; 438/738
(58) Field of Classification Search ........... 216/58, 216/80; 438/782
See application file for complete search history.

(56) References Cited
U.S. PATENT DOCUMENTS
2001/0034137 A1 10/2001 Nambu ............... 438/725

2007/0145639 A1 6/2007 Seki et al. ............... 264/293

FOREIGN PATENT DOCUMENTS

| JP | 05121560 A | * | 5/1993 |
|----|------------|---|--------|
| JP | 8-316209 | | 11/1996 |
| JP | 10-289952 | | 10/1998 |
| JP | 2849286 | | 11/1998 |
| JP | 2000-340549 | | 12/2000 |
| JP | 2001-308175 | | 11/2001 |

OTHER PUBLICATIONS

Thompson, E. et al.,"Fabrication of Step and Flash™ Imprint Lithography Templates Using Commercial Mask Processes", SPIE Microlithography Conference, Feb. 2003, ten sheets.

* cited by examiner

*Primary Examiner*—Roberts Culbert
(74) *Attorney, Agent, or Firm*—Fitzpatrick, Cella, Harper & Scinto

(57) ABSTRACT

A process for producing a structure containing silicon oxide includes a step of forming a first layer of organic spin-on glass on a substrate and a step of forming a second layer of inorganic spin-on glass on the first layer. Thereafter, the first layer is etched by using a pattern formed on the second layer as a mask and then the first layer and the second layer are calcined to prepare the structure containing silicon oxide.

5 Claims, 5 Drawing Sheets (a)

(b)

(c)

(a)

(b)

(c)

PRODUCTION PROCESS OF STRUCTURE

FIELD OF THE INVENTION AND RELATED ART

The present invention relates to a production process of a structure.

Silicon dioxide ($SiO_2$) such as quartz has been used as a material for a mold for nanoimprint, an optical waveguide, an optical switch, a biochip such as μ-TAS (micro total analysis system), and the like.

With respect to etching of silicon dioxide, a technique using a hard mask has been described in Ecron Thompson, Peter Phyins, Ron Voisin, S. V. Sreenivasan, Patrick Martin, "Fablication of Step and Flash Imprint Lithography Template Using Commercial Mask Processes", SPIE Microlithography Conference, February 2003. This technique will be described with reference to FIGS. 7(a) to 7(c).

First, as shown in FIG. 7(a), a chrome layer as a hard mask 710 is formed on an $SiO_2$ substrate and thereon, a resist 720 is formed.

Next, as shown in FIG. 7(b), patterning of the resist 720 is performed by using lithography and etching of the hard mask 710 is effected by using the resist 720 as an etching mask.

Further, as shown in FIG. 7(c), the $SiO_2$ substrate 700 is etched by dry etching using the hard mask 710 as a mask. The etching of $SiO_2$ ordinarily requires high ion energy compared with other materials. For this reason, in view of a load on the mask, the hard mask 710 is used as the etching mask.

However, a process using a metal material as the hard mask as in the above described etching technique is accompanied with the following problem.

That is, a structure containing $SiO_2$ is used for a device requiring optical transparency or insulative property in many cases. In these cases, it is undesirable that an opaque substance or a substance having an optical characteristic largely different from that of $SiO_2$ remains on the surface of the structure, so that removal of the hard mask is required.

As a process for removing the hard mask, wet etching, dry etching, and the like can be considered but these processes require an expensive apparatus, an occupied space, a chemical solution, an etching gas and the like.

Ordinarily, in the dry etching, even when a process having a high selection ratio is used, the underlying layers are somewhat damaged. For this reason, the surface of a mold substrate can be roughened or an edge blur of the pattern can be caused.

In the case of using the wet etching, the high selection ratio is obtained relatively easily compared with the case of the dry etching but with a size reduction or high aspect ratio of the pattern, the pattern falls or is broken in some cases due to a surface tension generated during drying of a liquid present between pattern portions.

Further, by these removing processes, the metal material is not always removed completely at an atomic level, so that contamination with metal caused by a residual component can be problematic depending on a device used.

SUMMARY OF THE INVENTION

The present invention is accomplished in view of the above described problems. A principal object of the present invention is to solve the above described problems. Specifically, an object of the present invention is to provide a production process of a structure containing silicon oxide capable of being prepared without using a hard mask consisting of a chrome film.

According to an aspect of the present invention, there is provided a production process of a structure containing silicon oxide, comprising:

a step of preparing a substrate;

a step of forming a first layer comprising organic spin-on glass on the substrate;

a step of forming a second layer comprising inorganic spin-on glass on the first layer;

a step of forming a pattern on the second layer;

a step of etching the first layer by using the pattern formed on the second layer as a mask; and a step of calcining the first layer and the second layer.

According to another aspect of the present invention, there is provided a production process of a structure containing silicon oxide, comprising:

a step of preparing a substrate;

a step of forming a first layer comprising a carbon-containing silicon oxide compound having a first carbon content on the substrate;

a step of forming, on the first layer, a second layer comprising a carbon-containing silicon oxide compound having a second carbon content smaller than the first carbon content;

a step of forming a pattern on the second layer;

a step of etching the first layer by using the pattern formed on the second layer as a mask; and a step of calcining the first layer and the second layer.

According to the present invention, it is possible to produce the structure containing silicon oxide without using the chrome film hard mask.

These and other objects, features and advantages of the present invention will become more apparent upon a consideration of the following description of the preferred embodiments of the present invention taken in conjunction with the accompanying drawings.

DETAILED DESCRIPTION OF THE PREFERRED EMBODIMENTS

As described above, the chrome (Cr) hard mask has been used for etching silicon oxide such as quartz.

According to study of the present inventors, it has been found that organic SOG (spin-on glass) can be etched by using inorganic SOG as a mask. More specifically, it has been found that etching rates of two materials capable of providing silicon oxide by calcination are different from each other.

According to the present invention, by utilizing this characteristic, the organic SOG is processed and calcined at high temperature to form a structure containing silicon oxide ($Si_xO_y$) such as $SiO_2$.

In the conventional process, the mask material used is different from silicon oxide, thus being required to be removed. However, in the present invention, it is possible to prepare the silicon oxide structure with no removal of the mask.

An embodiment of the production process of the silicon oxide structure of the present invention will be described with reference to FIGS. 1(a) to 1(c).

Figure 1:
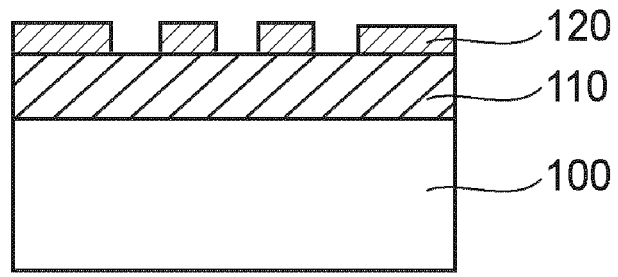
FIGS. 1(a) to 1(c) are schematic views for illustrating a production process of a structure containing silicon oxide in an embodiment of the present invention.
Figure 1:
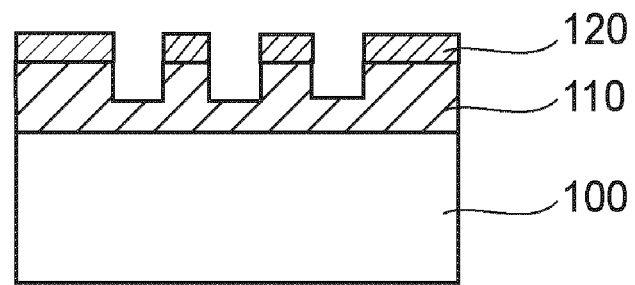
Figure 1:
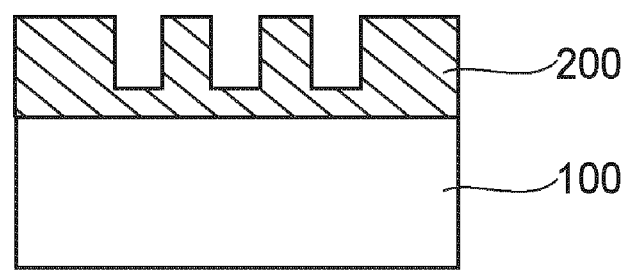

Referring to FIG. 1(a), a first layer 110 comprising organic SOG is formed on a substrate 100 and thereon, a patterned second layer 120 comprising inorganic SOG is formed.

Next, as shown in FIG. 1(b), etching of the first layer 110 comprising organic SOG is performed by using the second layer 120 comprising inorganic SOG as a mask.

Finally, the first layer 110 comprising organic SOG and the second layer 120 comprising inorganic SOG are calcined to produce a structure having a layer 200 of silicon oxide (e.g., $SiO_2$).

Here, the organic SOG is ordinarily formed in an insulating film having Si—O bond (linkage) by applying a liquid using $Si(OR)_4$ and $R_1Si(OR_2)_3$ as starting materials and baking the liquid. $R_1$ and $R_2$ are organic groups such as methyl ($CH_3$—), phenyl ($C_6H_5$—), and the like are remain in the film after the baking. The organic component content is ordinarily 10 wt. % or more.

The inorganic SOG is ordinarily formed in an insulating film having Si—O bond by applying a liquid using $HSi(OR)_3$ and baking the liquid. Ordinarily, the organic component does not remain in the film after the baking or remains in a small amount of less than 5 wt. %.

The above described production process of the silicon oxide structure is applicable to productions of the nanoimprint mold, the optical waveguide, the optical switch, and the biochip such as the μ-TAS, and a semiconductor fabrication process and the like.

Embodiment 1

FIGS. 2(a) to 2(e) are schematic sectional views for illustrating a production process of a silicon oxide structure according to this embodiment.

Referring to FIG. 2(a), a substrate 100 is an $SiO_2$ substrate such as a synthetic quartz wafer. On the substrate 100, a first layer 110 comprising organic SOG is formed. On the first layer 110, a second layer 120 comprising inorganic SOG is formed. The first layer 110 and the second layer 120 are formed by spin coating or the like.

On the second layer 120, a resist 130 is formed and patterned (FIG. 2(b)). As a method of patterning the resist q130, it is possible to use, e.g., light exposure using a stepper, a scanner, or the like and electron beam or X-ray lithography.

Next, by using the patterned resist 130 as a mask layer, the second layer 120 is etched and then the resist 130 is removed (FIG. 2(c)). As a method of etching the second layer 120, for example, it is possible to use reactive ion etching using, as parent gas, fluorocarbon-based gas such as $CF_4$, $CHF_3$, $C_3F_8$, $C_4F_8$, $C_5F_8$, or $C_4F_6$.

Then, by using the second layer as a mask layer, the first layer 110 is etched until an etched portion reaches the structure 100 (FIG. 2(d)). Incidentally, the first layer 110 may also be etched by using the second layer 120 in combination with the patterned resist 130 as the mask layer without removing the resist 130. As a method of etching the first layer 110, it is possible to use reactive ion etching using gas such as $H_2$, $N_2/H_2$ mixed gas, or $N_2/NH_3$ mixed gas.

Generally, etching of $SiO_2$ proceeds in the form of volatile components of $SiF_x$ and $CO_x$ produced by the CF-based gas, so that the etching does not proceed when carbon (C) is not contained in the reactant gas. For this reason, it is difficult to etch $SiO_2$ in the gas such as $H_2$, $N_2/H_2$ mixed gas, or $N_2/NH_3$ mixed gas.

From this fact, also with respect to the organic SOG and the inorganic SOG which are capable of providing silicon oxide by calcination, it is ordinarily considered that the organic SOG and the inorganic SOG cannot be etched even by using the gas such as $H_2$, $H_2/N_2$ mixed gas, or $H_2/NH_3$ mixed gas.

However, according to study of the present inventors, by using the gas such as $H_2$, $H_2/N_2$ mixed gas, or $H_2/NH_3$ mixed gas, it has been found that etching rates are different between the organic SOG and the inorganic SOG.

The reason why such a phenomenon occurs has not been clarified as yet but the present inventors consider as follows.

Carbon (C) is not present in the $H_2$ gas, the $H_2/N_2$ mixed gas, or the $H_2/NH_3$ mixed gas as an etchant but is present in the organic SOG to be etched. Therefore, from C attributable to the organic SOG, $CO_x$ is formed to constitute the volatile component. Further, N and H are contained in the etching gas, so that it can be considered that NO or $SiH_2$ constitute the volatile components.

The carbon (C) content contained in the inorganic SOG is small or zero, so that an amount of the $CO_x$ volatile component is small. The reason why the volatilization of NO or $SiH_2$ does not proceed has not been clarified but may be attributable to dominant action of the $CO_x$ volatile component compared with the NO and $SiH_2$ volatile components.

For the reasons described above, when the gas such as $H_2$, $H_2/H_2$ mixed gas, or $H_2/NH_3$ mixed gas is used, it is considered that etching of the organic SOG can be performed by using the inorganic SOG as the mask.

By using the gas such as $H_2$, $H_2/N_2$ mixed gas, or $H_2/NH_3$ mixed gas, an etching selection ratio between the first layer 110 and the second layer 120 is 10 or more depending on a condition in some cases.

Finally, the above prepared structure calcined at high temperature. As a result, carbon in the first layer 110 is eliminated from the first layer 110 to form a layer 200 of silicon oxide (e.g., $SiO_2$). Further, in both of the first layer 110 and the second layer 120, portions in a polymer state or an amorphous state are crystallized.

Figure 2:
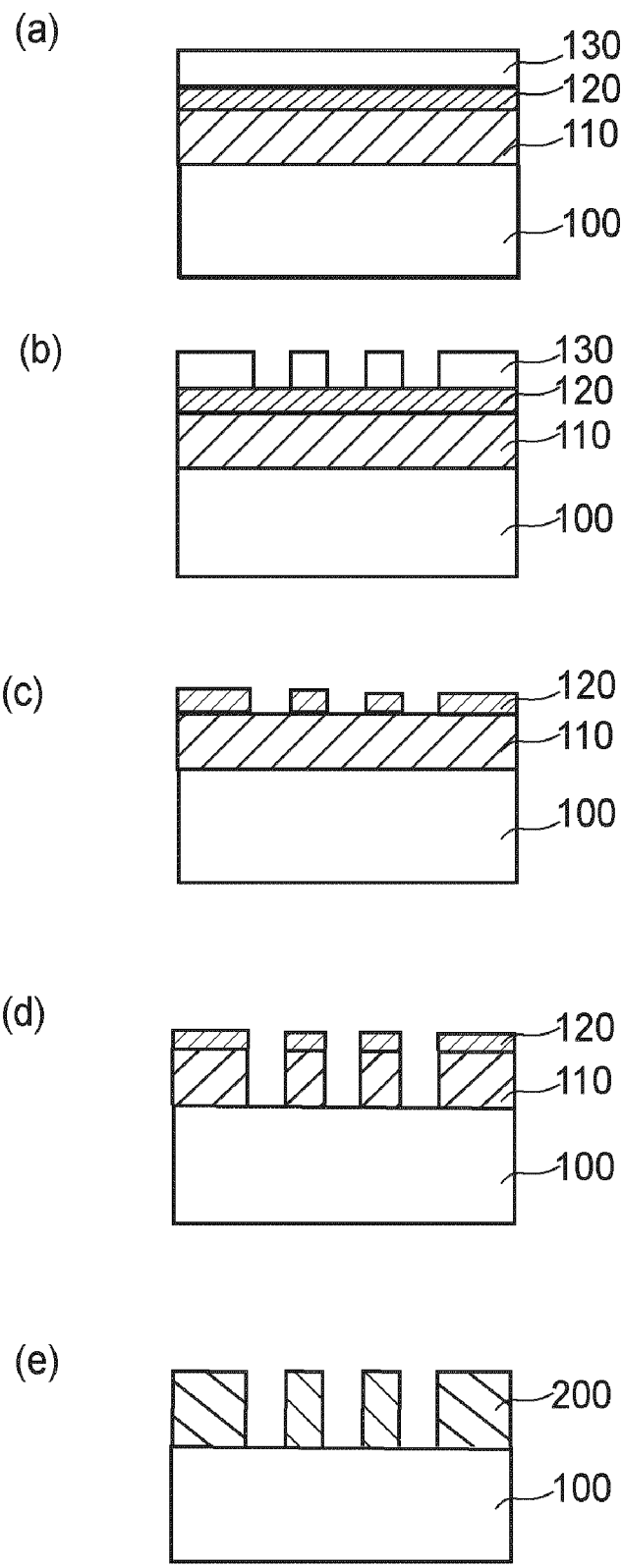
FIGS. 2(a) to 2(e) are schematic views for illustrating a production process of a structure containing silicon oxide in Embodiment 1 of the present invention.

As described above, it is possible to form the structure having the silicon oxide layer 200 (FIG. 2(5)).

A temperature at which the elimination of carbon from the first layer 110 starts is ordinarily about 450° C. For this reason, it is preferable that a calcination temperature is 450° C. or more.

Further, $SiO_2$ is changed in crystal form from trigonal system (hexagonal cylinder-like) crystal to hexagonal system (hexagonal bipyramid-like) crystal at 573° C. For this reason, the calcination temperature may preferably be 450° C. or more and 573° C. or less. In order to accelerate the carbon elimination to some extent and prevent the change in crystal form, the calcination temperature may further preferably be 470° C. or more and 550° C. or less.

By optimizing the calcination temperature and a calcination time, it is also possible to change the first layer 110 to a layer of silicon oxide (e.g., SiO) having a very small or no amount of the carbon content.

Incidentally, in the conventional process as described in the above mentioned SPIE article, there is no etching stopper in the etching process using the metal material as the hard mask.

Figure 8:
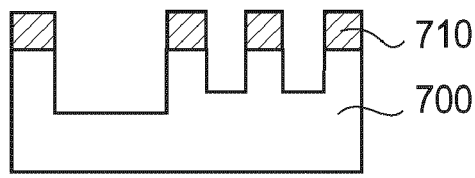

Generally, in many cases, an etching rate by dry etching varies depending on opening width. For this reason, it is difficult to keep an etching depth at a constant level in preparation of a device having a pattern with different opening widths. FIG. 8 shows such a case, wherein a hard mask 710 is disposed on an $SiO_2$ substrate 700.

In the case where $SiO_2$ is used as the material for the substrate 100, it is possible to obtain an appropriate etching ratio between the first layer 110 and the substrate 100. For this reason, the substrate 100 functions as an etching stopper, so that the etching depth does not depend on the opening width but is constant at a value determined by a thickness of the first layer 110.

In the step shown in FIG. 2(d), the etching of the first layer 110 proceeds so that an etched portion reaches the substrate 100. However, the etching of the first layer 110 may also be stopped at an intermediary portion of the first layer 110 as shown in FIG. 1(b).

Figure 3:
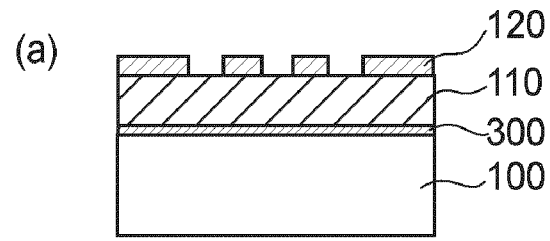
FIGS. 3(a) and 3(b) are schematic views for illustrating an etching stop layer.
Figure 3:
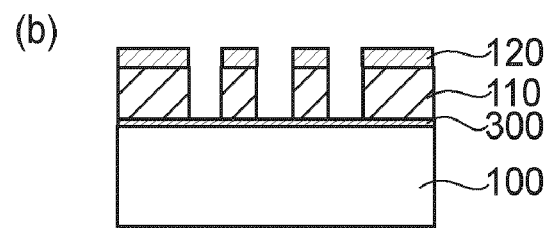

As the substrate 110, it is also possible to use a substrate other than the $SiO_2$ substrate. In this case, as shown in FIGS. 3(a) and 3(b), by providing an etching stop layer 300 such as an $SiO_2$ film on the substrate 100, it is also possible to stop the etching of the first layer 110. As a result, the etching depth does not depend on the opening width of the pattern but is constant at a value determined by the thickness of the first layer 110. As a method of forming the etching stop layer 300, it is possible to use thermal oxidation, CVD, spin coating, etc.

Figure 4:
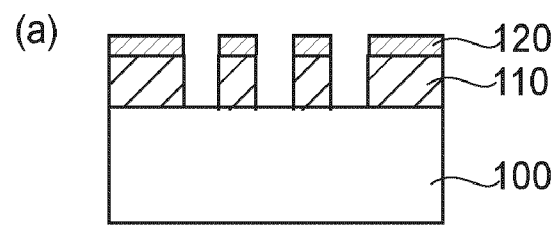
FIGS. 4(a) and 4(b) are schematic views for illustrating etching of a substrate.
Figure 4:
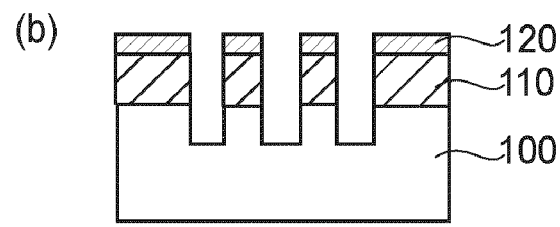

Further, depending on the etching rate, it is also possible to etch the substrate 100 by using the second layer 120 as a mask as shown in FIGS. 4(a) and 4(b).

Figure 5:
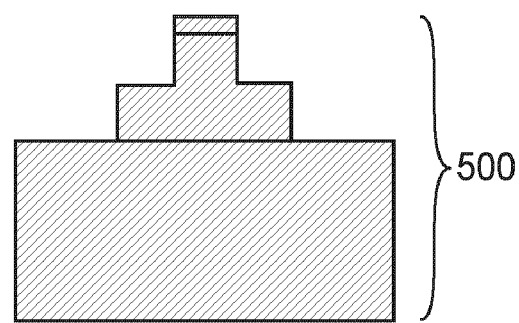
FIG. 5 is a schematic view showing an example of a stepped structure.

The production process of the structure of this embodiment is also applicable to preparation of a stepped structure 500 as shown in FIG. 5.

Figure 6:
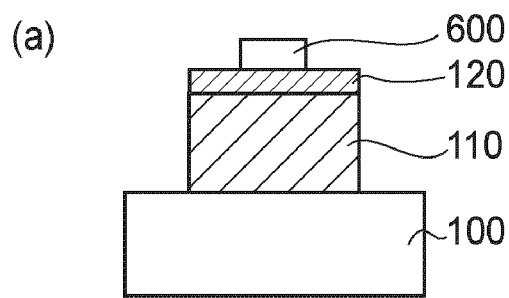
FIGS. 6(a) to 6(c) are schematic views for illustrating a production process of the stepped structure.
Figure 6:
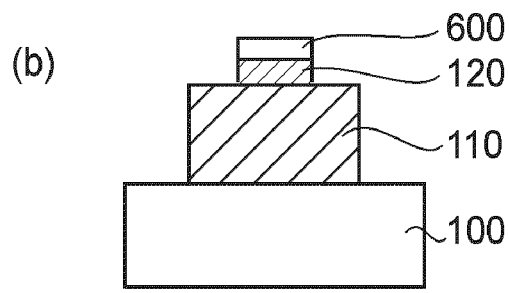
Figure 6:
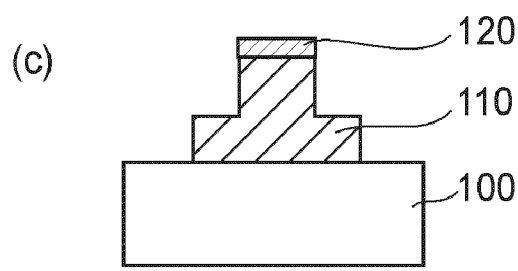
Figure 7:
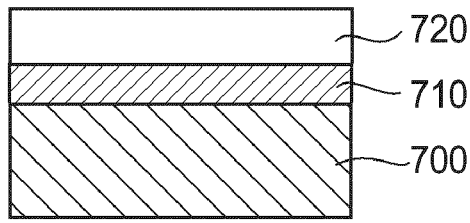
FIGS. 7(a), 7(b), 7(c) and 8 are schematic views for illustrating a conventional production process of a structure containing silicon oxide.
Figure 7:
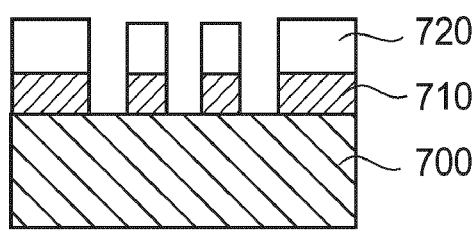
Figure 7:
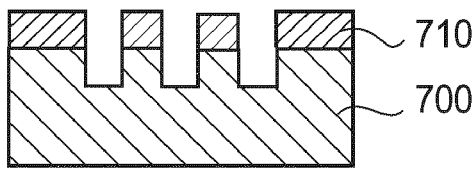

FIGS. 6(a) to 6(c) are schematic sectional views for illustrating a production process of the stepped structure 500.

First, the same process as that described with reference to FIGS. 2(a) to 2(d) is performed to form the structure in which the first layer 110 and the second layer 120 are formed on the substrate 100. Next, as shown in FIG. 6(a), a resist 600 is formed on the second layer 120 and patterned to have a pattern different from that of the second layer 120.

Next, by using the patterned resist 600 as a mask, the second layer 120 is etched (FIG. 6(b)).

Then, after the patterned resist 600 is removed, the first layer 110 is etched in a desired depth by using the second layer 120 as a mask (FIG. 6(c)). The first layer 110 may also be etched by using the second layer 120 in combination with the resist 600 as the mask without removing the resist 600.

Finally, the thus prepared structure is calcined at high temperature, so that it is possible to produce the stepped structure 500 having the layer of silicon oxide (e.g., $SiO_2$).

Embodiment 2

In Embodiment 1, the organic SOG is used as the first layer 110 and the inorganic SOG is used as the second layer 120. Further, the structure is formed by utilizing the difference in etching rate between both of the layers.

The reason why the difference in etching rate between both of the layers is caused can be considered that the amounts of carbon components in the organic SOG and the inorganic SOG contribute to the etching rate difference as described above. Therefore, the first and second layers 110 and 120 are not always limited to SOG.

It is also possible to use a silicon oxide compound containing carbon as a material for the first layer 110 and a silicon oxide compound containing no carbon as a material for the second layer 120.

Further, even in the case where the second layer 120 contains a small amount of carbon, when the first layer 110 contains carbon in an amount larger than that of the second layer 120, the difference in etching rate is caused between the first layer 110 and the second layer 120. In this case, it is desirable that a difference in carbon content between the first layer 110 and the second layer 120 is 10 wt. % or more. By using these two layers, it is possible to etch the first layer 110 by using the second layer 120 as a mask.

When the first layer 110 is formed on the substrate 100, a method such as CVD or the like is used.

A production process of a structure containing silicon oxide according to this embodiment includes a step of preparing a substrate; a step of forming, on the substrate, a first layer comprising a carbon-containing silicon oxide compound having a first carbon content; and a step of forming, on the first layer, a second layer comprising a carbon-containing silicon oxide compound having a second carbon content. The production process further includes a step of forming a pattern on the second layer, a step of etching the first layer by using the pattern formed on the second layer as a mask, and a step of calcining the first layer and the second layer.

A difference in carbon content between the first layer and the second layer may be 10 wt. % or more.

In the step of etching the first layer, as etching gas, it is possible to use $H_2$ gas, $H_2/N_2$ mixed gas, or $H_2/NH_3$ mixed gas.

Further, in the step of etching the first layer, the etching may also be stopped by a surface of the substrate or an etching stop layer provided on the substrate.

Further, the structure containing silicon oxide may also be a structure containing silicon dioxide.

While the invention has been described with reference to the structures disclosed herein, it is not confined to the details set forth and this application is intended to cover such modifications or changes as may come within the purpose of the improvements or the scope of the following claims.

This application claims priority from Japanese Patent Applications Nos. 229052/2006 filed Aug. 25, 2006 and 148555/2007 filed Jun. 4, 2007, which are hereby incorporated by reference.

What is claimed is:

1. A production process of a structure containing silicon oxide, comprising:
   a step of preparing a substrate;
   a step of forming a first layer comprising organic spin-on glass on the substrate;
   a step of forming a second layer comprising inorganic spin-on glass on the first layer;
   a step of forming a pattern on the second layer;
   a step of etching the first layer by using the pattern formed on the second layer as a mask; and
   a step of calcining the first layer and the second layer.

2. A process according to claim 1, wherein in the step of etching the first layer, an etching gas is selected from the group consisting of $H_2$, a mixed gas of $N_2$ and $H_2$, and a mixed gas of $N_2$ and $NH_3$.

3. A process according to claim 1, wherein the substrate comprises silicon oxide.

4. A process according to claim 1, wherein in the step of etching the first layer, the etching is stopped by a surface of the substrate or an etching stop layer provided on the substrate.

5. A process according to claim 1, wherein the structure containing silicon oxide is a structure containing silicon dioxide.

* * * * *